United States Patent [19]

Abramowitz et al.

[11] Patent Number: 4,845,545
[45] Date of Patent: Jul. 4, 1989

[54] LOW PROFILE SEMICONDUCTOR PACKAGE

[75] Inventors: Howard M. Abramowitz, Los Angeles; Jerry R. Carpenter, San Pedro; Dennis Meddles, Torrance, all of Calif.

[73] Assignee: International Rectifier Corporation, El Segundo, Calif.

[21] Appl. No.: 14,659

[22] Filed: Feb. 13, 1987

[51] Int. Cl.[4] .................. H01L 23/02; H01L 23/28; H01L 23/16; H01L 39/02
[52] U.S. Cl. ........................... 357/74; 357/72; 357/75; 357/80
[58] Field of Search .......... 357/76, 74, 75, 72, 357/80

[56] References Cited

U.S. PATENT DOCUMENTS

| 3,654,527 | 11/1981 | McCann | 357/74 |
| 4,272,644 | 6/1981 | Visser et al. | 357/74 |
| 4,314,271 | 2/1982 | Heyke et al. | 357/76 |
| 4,675,718 | 6/1987 | Tsubokura et al. | 357/72 |

FOREIGN PATENT DOCUMENTS

| 2556562 | 6/1977 | Fed. Rep. of Germany | 357/72 |
| 55-130153 | 10/1980 | Japan | 357/72 |
| 57-155752 | 9/1982 | Japan | 357/72 |

OTHER PUBLICATIONS

Perrin, Electron and Appl. Ind. (France) No. 235 (15 Apr. 1977) pp. 15-17.
Matoba et al., Mitsubishi Denki Giho, vol. 53, No. 9, pp. 663-667, (Sep. 1979).

Primary Examiner—Andrew J. James
Assistant Examiner—Gregory Key
Attorney, Agent, or Firm—Ostrolenk, Faber, Gerb & Soffen

[57] ABSTRACT

A flat thin package for semiconductor die has rigid leads extending perpendicularly from its length which can be plugged into a printed circuit board socket. The package has a low profile above the surface of the printed circuit board.

3 Claims, 2 Drawing Sheets

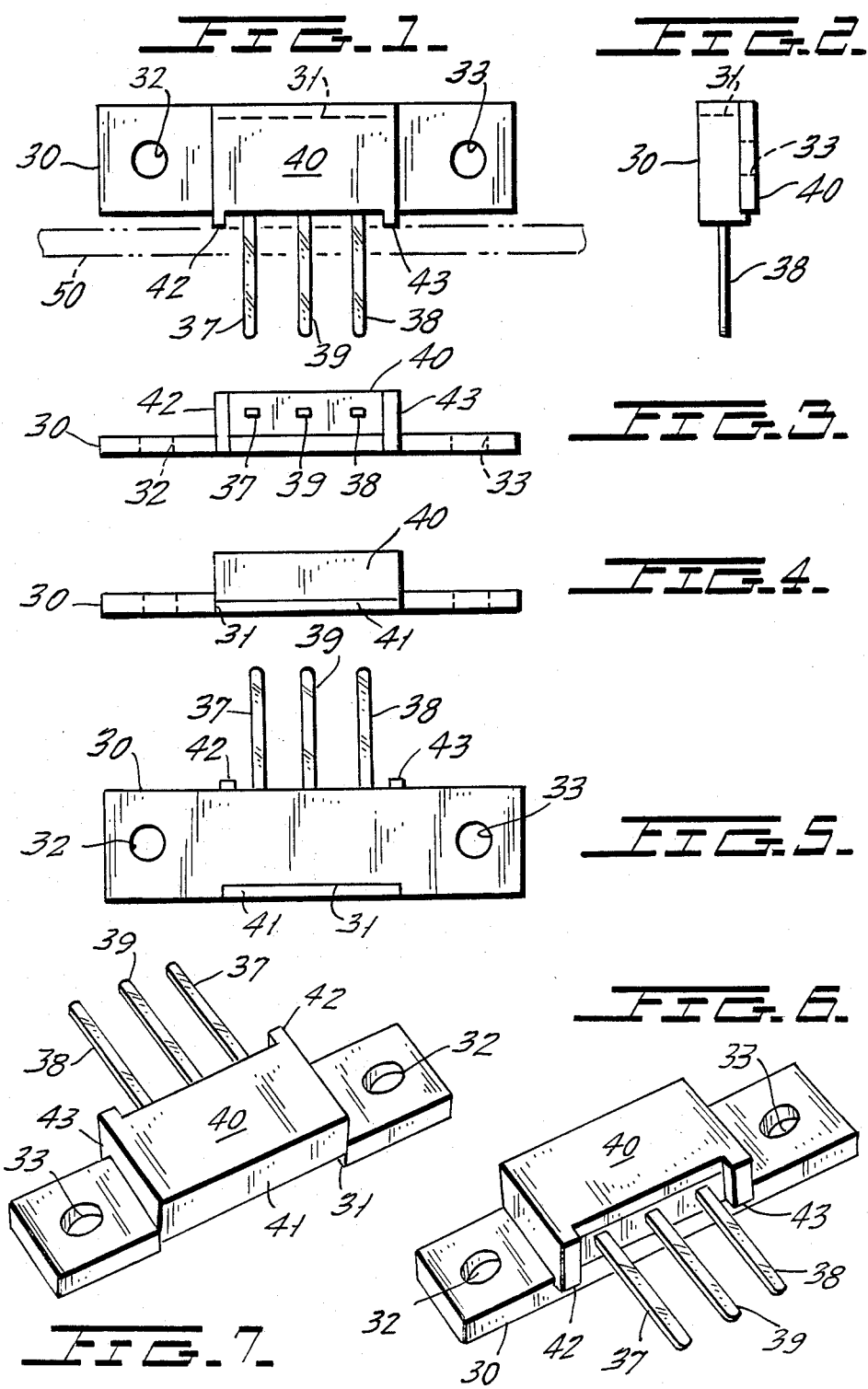

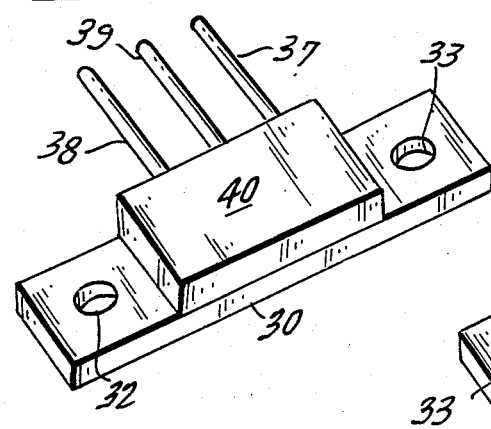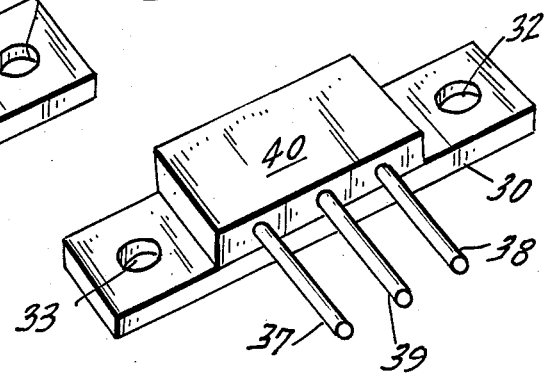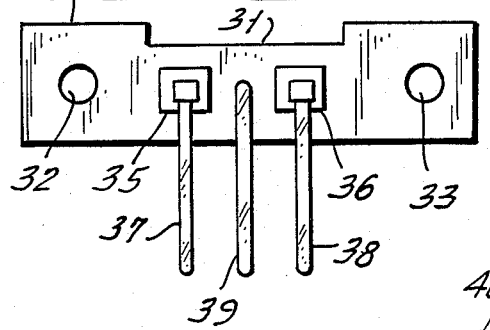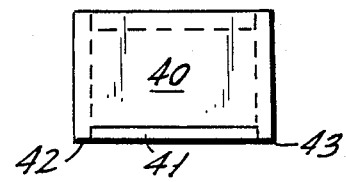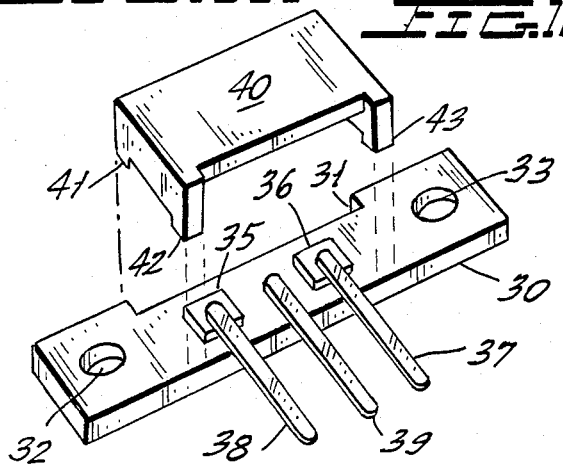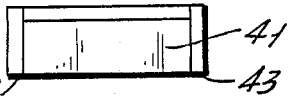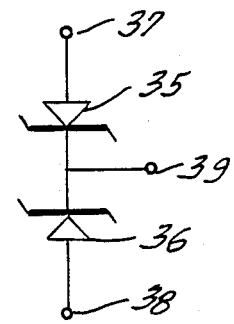

LOW PROFILE SEMICONDUCTOR PACKAGE

RELATED APPLICATIONS

This application is related to application Ser. No. 14,716, filed Feb. 13, 1987 in the names of Abramowitz, Carpenter and Meddles.

BACKGROUND OF THE INVENTION

This invention relates to a package for semi-conductor devices, and more specifically relates to a plastic encapsulated package which can be plugged perpendicularly into a socket in a printed circuit board while having a low vertical height above the board.

Packages for semiconductor die are well-known. Such packages contain single or plural die of the same or diverse types. Packages for semiconductor die are needed to mechanically house and protect the die from ambient conditions and provide rigid output leads from electrodes on the die, which leads can be plugged into cooperating sockets or can otherwise be connected to output circuits.

When such packages are to be plugged into a printed circuit board, it is preferred that they occupy as small an area on the board as possible. For this purpose, the package may be mounted in an upright or erect position. When mounted upright, they occupy a relatively small area on the printed circuit board but they stand above the board by a considerable distance, thus interfering with stacking of boards in parallel to one another with compact spacing.

SUMMARY OF THE INVENTION

In accordance with the present invention, a novel semiconductor package is provided which has a very low profile above a printed circuit board when it is plugged perpendicularly into a socket on the board while also occupying a relatively small area of the board. Moreover, the novel package of the invention is simple in configuration and relatively inexpensive, while still providing efficient heat sinking of the die contained within the package.

More specifically and in accordance with the invention, the package consists of a relatively thin, flat conductive bar which is relatively short in width as compared to its length. Semiconductor die are fixed to one flat surface of the conductive member. Rigid leads extend from the semiconductor elements and from the bar in a plane parallel to the flat surface of the bar and perpendicular to the length of the bar.

The semiconductor die which are fixed to the bar are then encapsulated by a shallow premolded cap which is back filled with epoxy to protect the die and secure the cap to the conductive substrate. If desired, a transfer-molding process can be employed to form a low height encapsulation cap around the die.

The conductive support bar may have a notch about one side thereof. This notch provides an interference fit with a projection from the cap for aligning the insulation cap longitudinally along the width of the bar. The cap can also have legs projecting below its bottom surface so that they overlie the edge of the bar opposite to the edge containing the notch. This then secures the cap transversely relative to the length of the bar. These latter projections may also serve to space the lower edge of the bar above the plane of the printed circuit board by a dimension equal to the length of the projections.

The bar contains openings at its opposite ends which can receive electrical connection devices or screws. The spacing of these openings and the width of the bar are designed to enable use of automatic nut driving tools.

BRIEF DESCRIPTION OF THE DRAWINGS

FIG. 1 is a plan view of the package of the invention.
FIG. 2 is a side elevation view of FIG. 1.
FIG. 3 is a front elevation view of FIG. 1.
FIG. 4 is a rear view of FIG. 3.
FIG. 5 is a bottom view of FIG. 1.
FIG. 6 is a perspective view of the package of FIGS. 1 through 5 as seen from the top front of the package.
FIG. 7 is a perspective view of the package of FIGS. 1 through 5 as seen from the top rear of the package.
FIG. 8 is a perspective view of a second embodiment of the invention as seen from the same angle of FIG. 6.
FIG. 9 is a perspective view of the package of FIG. 7 as seen from the same angle of FIG. 7.
FIG. 10 shows the packages of FIGS. 1 through 7 with the insulation cap removed.
FIG. 11 is a top view of the insulation cap of FIGS. 1 through 7.
FIG. 12 is a side elevation view of the cap of FIG. 11.
FIG. 13 is a front elevation view of the cap of FIG. 11.
FIG. 14 is an exploded pespective view of the body of FIG. 10 and the cap of FIGS. 11, 12 and 13.
FIG. 15 is a circuit diagram of the circuit contained within the package of FIG. 14.

DESCRIPTION OF THE PREFERRED EMBODIMENTS

The novel housing of the present invention is shown in FIGS. 1 through 14 for the case of a dual Schottky hybrid package, the circuit of which is later described in connection with FIG. 15. The circuit has a very low forward voltage drop and the package has a very low profile. Thus, the package can be mounted vertically within a socket in a printed circuit board without need for excessive height above the printed circuit board. That is, the package has a "low profile."

Referring to FIGS. 1 to 10 and 14, the novel package of the invention contains a rectangular conductive bar 30 which may be of nickel-plated copper. The bar may have a thickness of about 2 millimeters, a width of about 9 millimeters and a length of about 38 millimeters. Other dimensions can be used but the general proportions stated above are preferred.

The nickel-plated copper bar 30 has a notch 31 shown in FIGS. 1, 2, 3, 5, 7, 10 and 14, which is about 1 millimeter in depth, although this depth is not critical. Two mounting openings 32 and 33 extend through the bar near its respective ends. These openings are symmetrically located from the ends of the copper bar 30 and are spaced on centers of about 20 millimeters and have diameters of about 5 millimeters. These dimensions are chosen to enable the use of an automatic nut driver for driving fasteners which extend through openings 32 and 33 for electrical connection to other circuits.

FIG. 10 shows the conductive bar 30 with two semiconductor die 35 and 36 (also shown in FIG. 14) soldered to the upper surface of the bar 30. Die 35 and 36 and Schottky diodes which have a metallizing on the bottoms of the chips which is soldered to the nickel-plated bar 30 by an appropriate solder, for example, a 96.5% tin, 3.5% silver solder. Any other device die can be used and any number of die can be used. Moreover, a thin insulation can be interposed between the die and the bar 30 if desired.

The upper surfaces of Schottky die 35 and 36 contain an upper electrode which is soldered to relatively rigid leads 37 and 38, respectively, which are shown in FIGS. 1, 5, 6, 7, 8, 9, 10 and 14. A central lead 39 of configuration similar to that of leads 37 and 38 is soldered directly to the bar 30 as shown in FIGS. 10 and 14.

Leads 37, 38 and 39 can be the leads of a lead frame and that they may have either a rectangular cross-section or circular cross-section. For example, in the embodiment of FIGS. 1, 5, 6, 7, 10 and 14, the leads have a flattened rectangular configuration and are about 1 millimeter wide and ½ millimeter thick. Clearly, however, circular leads can be used, as shown in FIGS. 8 and 9, where these leads can have a diameter, for example, of ¾ millimeters. The exact configuration of the leads is unimportant, so long as the leads are sufficiently rigid that they can be plugged into an appropriate socket on a printed circuit board.

The spacing between the leads 37, 38 and 39 is that defined by commercially available printed circuit board sockets and can, for example, be 5 millimeters center-to-center between adjacent leads. The lead length is also determined by the depth of conventional sockets and can be about 11 millimeters beyond the lower edge of the conductive bar 30 in FIGS. 1 and 10.

The Schottky die 35 and 36 with their respective leads form the electrical circuit shown in FIG. 15. In FIG. 15, the terminals of the circuit carry the same identifying numerals 37 and 38, respectively, of the leads of FIGS. 10 and 14, while the central common lead terminal carries the numeral 39, which in FIGS. 10 and 14 is the lead connected to the main conductive body 30.

In order to enclose and protect the die 35 and 36, a molded cap 40 is provided as shown in FIGS. 1 through 9 and 11 through 14. Cap 40 may be a premolded cap formed of any suitable insulation material such as a material carrying the trade name Ryton R-4. The cap is dimensioned to fit over die 35 and 36 and defines a sealed area over the die which is enclosed by the upper surface of bar 30. The interior of the cap is then back-filled with an appropriate liquid epoxy back fill such as No. 1035 Hysol, which is later cured to seal the cover in place and to hermetically seal the die 35 and 36 and their lead connections to the bar 30. Cap 40 is shown in detail in FIGS. 11, 12 and 13 where it is shown how the cap 40 defines a cavity over the upper surface of the bar 30.

Cap 40 contains a rear skirt projection 41 shown in FIGS. 5, 7 and 11 through 14. This rear skirt 41 is adapted to project into the notch 31 in the bar 30 so as to lock the cap 40 against longitudinal motion along the length of bar 30 during molding. Note that skirt 41 can be eliminated, as shown in the arrangement of FIGS. 8 and 9 as when a transfer-molding operation is employed to form the insulation housing instead of the cap with epoxy back fill.

Two forwardly projecting legs 42 and 43 are also provided integrally with the cap 40. Legs 42 and 43 are arranged to overlie the bottom edge of bar 30 in order to fix the cap against transverse motion to the longitudinal axis of the bar 30 during molding. Thus, the cap 40 can be easily held in place while its interior is back-filled with liquid epoxy and is cured.

As shown in FIGS. 8 and 9, these legs 42 and 43, and indeed a separate cap, may be dispensed of with other packaging styles for the cap 40, which is a transfer-molded part in FIGS. 8 and 9.

The novel package housing described above in its two embodiments has a configuration different from that of existing packages and lends itself to low-height mounting above a printed circuit board. By way of example, FIG. 1 illustrates in dotted lines the thickness of a printed circuit board 50, which contains a socket (not shown) which conductively receives leads 37, 38 and 39 for connection to circuits which are either on or off the board 50. It will be seen that the bar 30 projects perpendicularly above the area of the printed circuit board 50 which is shown on edge in FIG. 1. Moreover, it will be observed that the legs 42 and 43 engage the upper surface of the board 50 and thus prevent the bottom edge of the bar 30 from contacting the surface of the board and possibly short-circuiting printed circuit lines on the board at that point. Moreover, the area projected perpendicularly on the board is the relatively small area defined by the thickness of the bar 30 and the height of cap 40 above the bar 30. Finally, the total height of the bar 30 above the surface of the board 50 is relatively small, thereby conserving the vertical height above the board in a novel and inexpensive manner.

Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

What is claimed is:

1. A plastic encapsulated semiconductor device housing for mounting by plug-in to a socket on a printed circuit board; said device comprising, in combination:

a relatively thin, flat conductive rectangular bar having a length greater than its width and a width greater than its thickness, said bar having parallel side edges spaced by said width of said bar and parallel major surface areas spaced by said thickness of said bar;

at least first and second semiconductor die each having first and second surfaces, said first surface of each of said die physically coupled to one of said parallel major surfaces of said conductive bar;

at least first, second and third elongated conductive leads each having a rididity sufficient to enable plug-in connection to a socket and each having a lateral cross-sectional area substantially smaller than that of said conductive bar, said first lead having one end connected to said second surface of said first die, said second lead having one end connected to said one of said major surfaces of said conductive bar at a point adjacent to at least one of said die, said third lead having one end connected to said second surface of said second die, said first, second and third elongated leads being parallel to one another and extending perpendicular to said length of said conductive bar, said first, second and third leads having substantially the same length and extending freely beyond one of said side edges of said bar;

and a rectangular insulation enclosure for hermetically enclosing said at least first and second die and portions of said first, second and third leads along the length thereof which are coextensive with the width of said bar;

said insulation enclosure consisting of a premolded insulation cap filled with an insulation epoxy which encapsulates said die and portions of said first, second and third leads and which secures said cap to said bar;

each of said least first and second die mounted on opposite sides of the longitudinal center of said bar and laterally centrally located on said one of said surfaces of said bar; said first, second and third leads being coplanar with one another and parallel to the planes of said major surface areas of said bar; said second lead being disposed between said first and third leads;

said cap having a longitudinal skirt extending from one side thereof and at least one leg extending from the opposite side thereof; said bar having a notch is one of said side edges thereof; said skirt of said cap fitting into said notch; said at least one leg of said cap extending over the other of said side edges of said bar.

2. The device of claim 1, wherein said first, second and third leads are rectangular in cross-section and are members of a common lead frame.

3. The device of claim 2, wherein said bar has first and second openings extending therethrough adjacent its opposite ends and spaced from the lateral edges of said rectangular insulation enclosure.

* * * * *